United States Patent [19]

Suzuki et al.

[11] 4,134,076

[45] Jan. 9, 1979

[54] PULSE WIDTH MODULATED SIGNAL AMPLIFIER

[75] Inventors: Tadao Suzuki; Takeshi Fukami, both of Tokyo, Japan

[73] Assignee: Sony Corporation, Tokyo, Japan

[21] Appl. No.: 857,176

[22] Filed: Dec. 2, 1977

[30] Foreign Application Priority Data

Dec. 6, 1976 [JP] Japan .................. 51-146325

[51] Int. Cl.² .............. H03F 3/38; H03F 3/183
[52] U.S. Cl. ................................ 330/10; 330/251; 330/253
[58] Field of Search .............. 330/10, 251, 207 A; 332/9 T

[56] References Cited

U.S. PATENT DOCUMENTS

| | | | |
|---|---|---|---|
| 3,509,479 | 4/1970 | Gucker et al. | 330/10 |
| 4,021,745 | 5/1977 | Suzuki et al. | 330/10 |

Primary Examiner—James B. Mullins
Attorney, Agent, or Firm—Lewis H. Eslinger; Alvin Sinderbrand

[57] ABSTRACT

A pulse width modulated signal amplifier includes an integrator having a positive or non-inverted input terminal supplied with a modulating signal, such as, an audio signal, and an inverted input terminal supplied with a rectangular wave signal as a carrier, a high gain amplifier receiving the output of the integrator and producing a pulse width modulated signal, a pulse power amplifier receiving the pulse width modulated signal, a low pass filter receiving the output of the pulse power amplifier and producing an amplified demodulated signal corresponding to the original modulating signal and which is supplied to an output terminal, and a negative feedback circuit connected between the output terminal of the pulse power amplifier and the inverted input terminal of the integrator.

10 Claims, 8 Drawing Figures

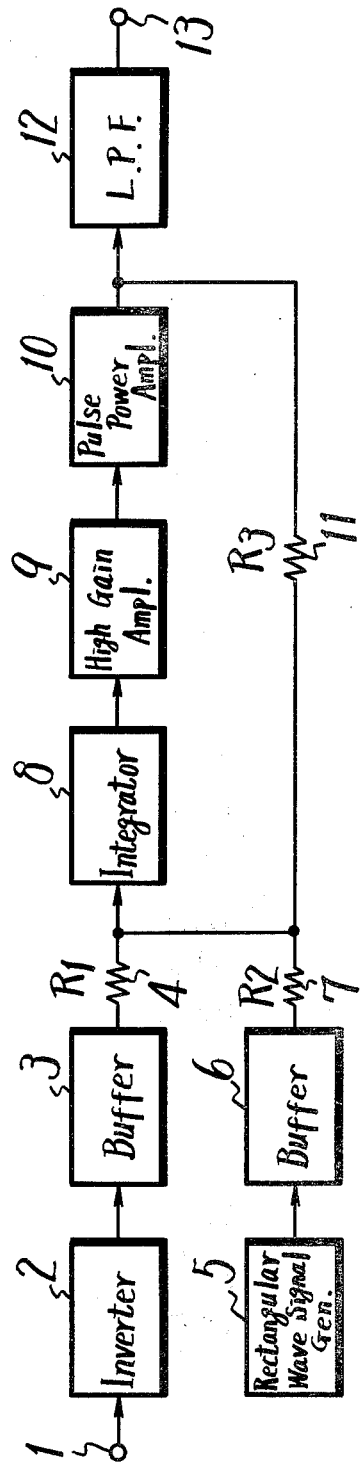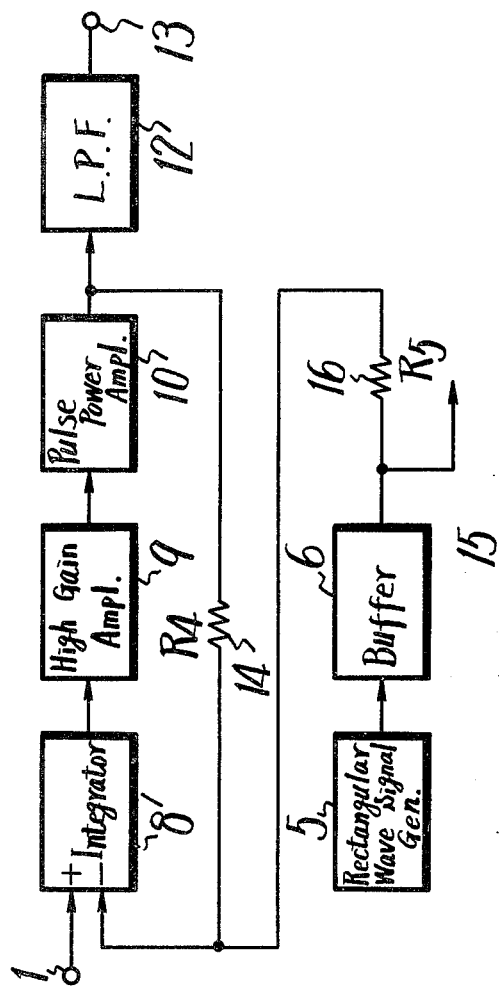

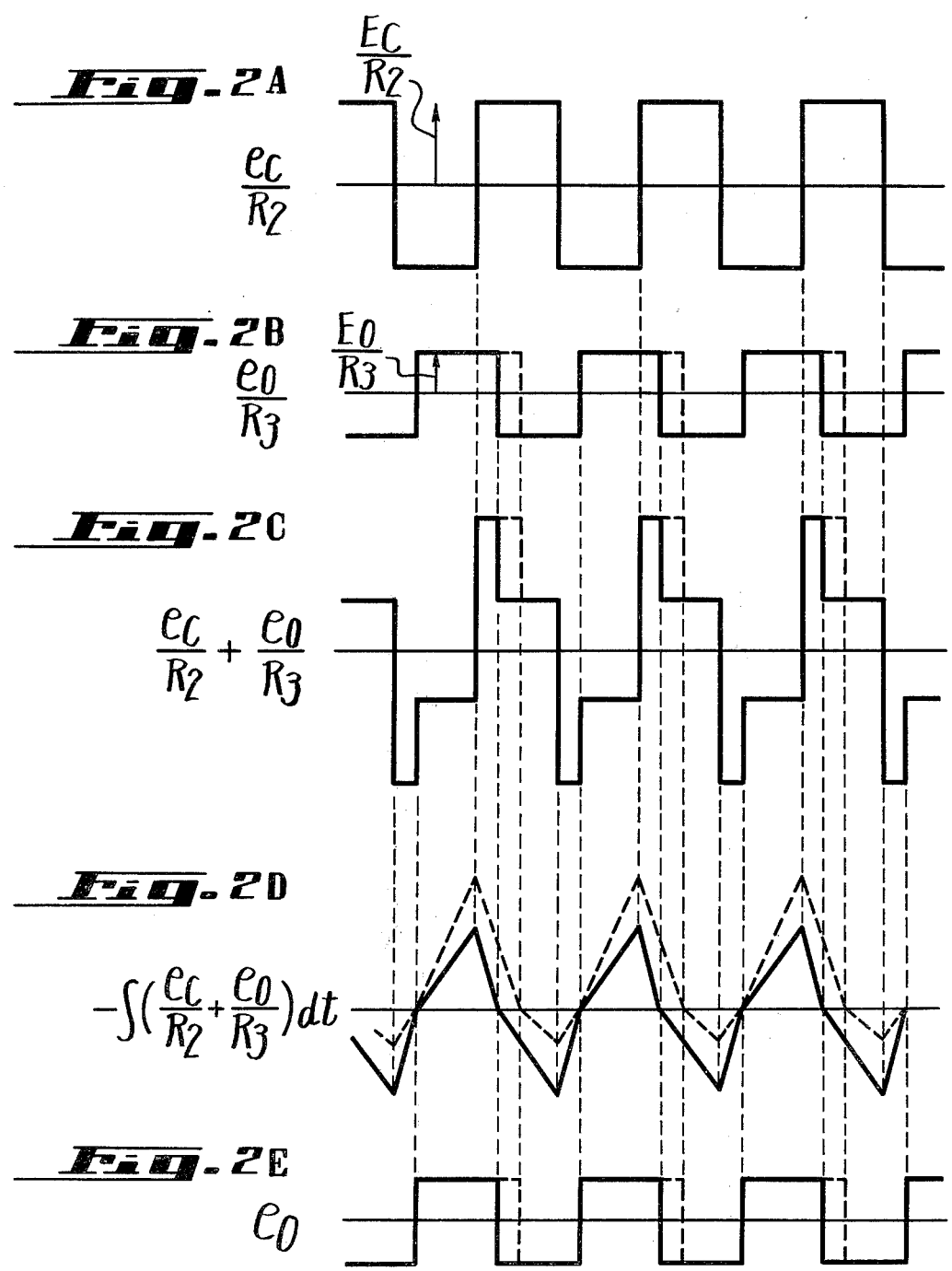

PULSE WIDTH MODULATED SIGNAL AMPLIFIER

BACKGROUND OF THE INVENTION

1. Field of the Invention

The present invention relates generally to a pulse width modulated signal amplifier, and more particularly is directed to an improved amplifier of the type which converts a low frequency signal, such as, an audio signal or the like, to a pulse width modulated signal, then amplifies the converted signal and demodulates the amplified signal to again obtain the original low frequency signal.

2. Description of the Prior Art

A pulse width modulated signal amplifier is known in which a low frequency input signal, such as, an audio signal or the like, is applied to a have inverter to obtain an inverted input signal which is composed with a rectangular waveform signal from a suitable generator and applied to an integrator. The resulting integrated signal is fed to a high gain amplifier which produces a pulse width modulated signal applied to a pulse power amplifier, and the output signal from the latter is supplied to a low pass filter which delivers an amplified low frequency output signal generally corresponding to the original low frequency input signal. Further, a part of the output of the pulse power amplifier is applied, as a negative feedback, to the input of the integrator.

The above described prior a pulse width modulated signal amplifier is advantageous in that the frequency of the pulse width modulated signal can be made constant and the negative feedback can be sufficient to ensure a desirably low modulation distortion factor. However, there are a number of inherent disadvantages. More particularly, the amplified low frequency output signal obtained from the described pulse width modulated signal amplifier is inverted in phase in respect to the low frequency signal applied to the input of the integrator. Therefore, it is necessary to supply the low frequency input signal to the integrator by way of the phase inverter, as previously described, for ensuring that the input and output signals will be of the same phase. Further, it is necessary to apply the inverted input signal to the integrator through a buffer providing a high input impedance in order to ensure that the gain of the amplifier will not vary with variations in the input signal.

OBJECTS AND SUMMARY OF THE INVENTION

Accordingly, it is generally an object of the present invention to provide an improved pulse width modulated signal amplifier.

More specifically, it is an object of the invention to provide a pulse width modulated signal amplifier which can provide a constant frequency of a pulse width modulated signal and which considerably reduces the modulation distortion factor while avoiding the mentioned disadvantages of the above described prior art amplifier;

It is another object of the invention to provide a pulse width modulated signal amplifier in which the low frequency input signal can be applied directly to an integrator without being passed through a phase inverter.

It is a further object of the invention to provide a pulse width modulated signal amplifier in which a negative feedback is applied from the input side of a low pass filter to the input side of an integrator so that the negative feedback can be applied sufficiently to substantially reduce the modulation distortion factor.

According to an aspect of the present invention there is provided a pulse width modulated signal amplifier which comprises first and second input terminals for receiving a modulating signal and a rectangular wave signal as a carrier, respectively, an integrating circuit having first and second inputs and an output, first and second circuits for connecting the first and second inputs of said integrating circuit to said first and second input terminals for supplying said modulating signal and said rectangular wave signal to said first and second inputs, respectively, of the integrating circuit, amplifying means connected with the integrating circuit output and preferably consisting of a high gain amplifying circuit and a pulse power amplifying circuit in sequence, a low pass filter connected to the output of said amplifying means, for example, to the pulse power amplifying circuit, for producing a demodulated signal, an output terminal receiving the demodulated signal from said low pass filter, and a negative feedback circuit connected between the output of the high gain amplifying circuit or of the pulse power amplifying circuit and said second input of the integrating circuit.

BRIEF DESCRIPTION OF THE DRAWINGS

FIG. 1 is a block diagram showing an example of a prior art pulse width modulated signal amplifier;

FIGS. 2A to 2E, inclusive, are waveform diagrams to which reference will be made in explaining the operation of pulse width modulated signal amplifiers of the prior art and the present invention;

FIG. 3 is a block diagram showing an embodiment of a pulse width modulated signal amplifier according to the invention.

DESCRIPTION OF THE PREFERRED EMBODIMENT

Figure 4:
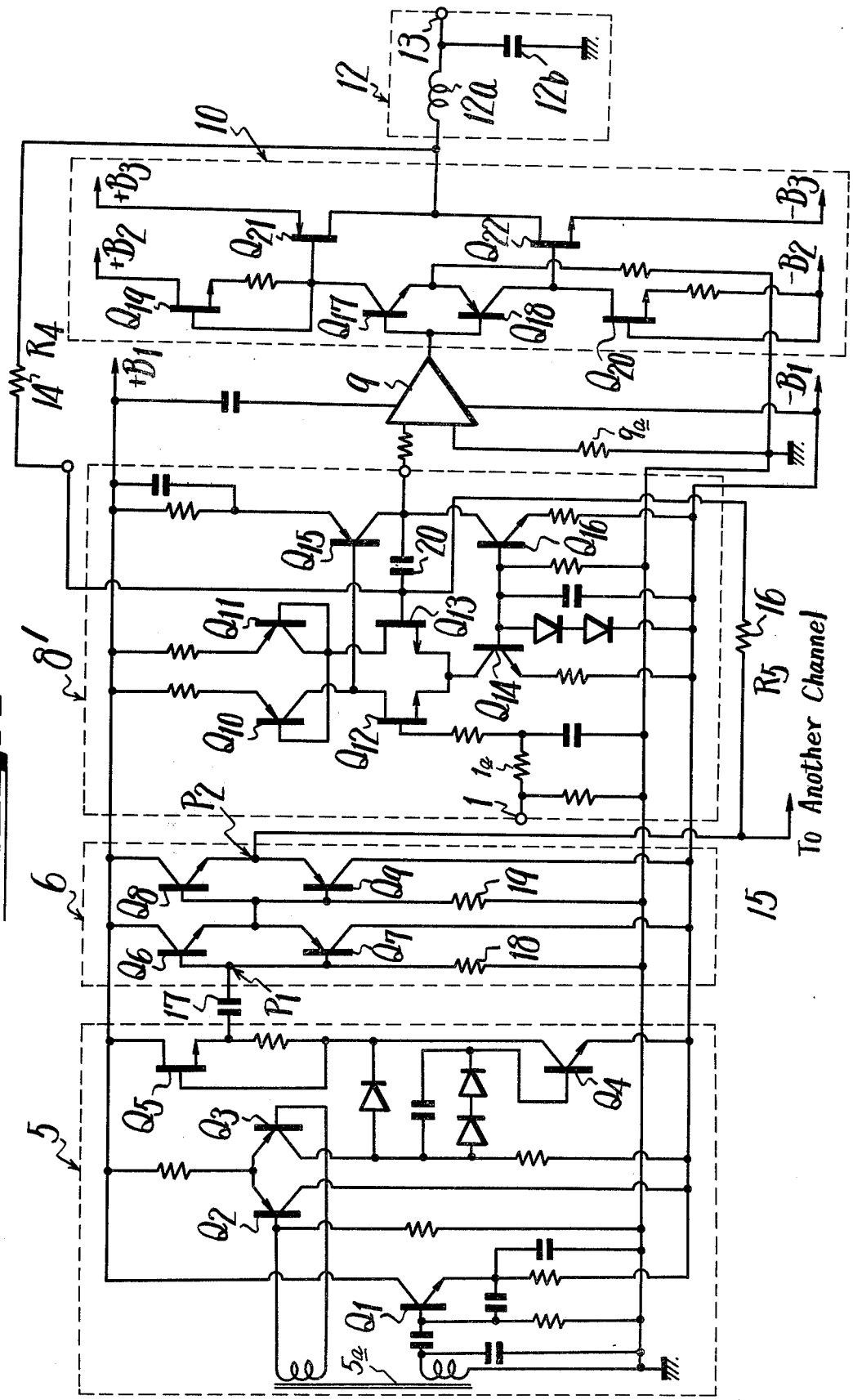
FIG. 4 is a circuit diagram showing a practical example of the amplifier of the invention shown in FIG. 3.

Before proceeding with a detailed description of the present invention, a pulse width modulated signal amplifier of the prior art will be described with reference to FIG. 1 so as to afford an appreciation of the problems to be solved by the invention. In the prior art amplifier shown on FIG. 1, a low frequency input signal, such as an audio signal or the like, is applied to an input terminal 1 and from the latter to an inverter or inverting amplifier 2 so as to be phase-inverted in the latter. The resulting inverted output from inverter 2 is fed to a buffer 3 acting as an impedance converter and the output signal therefrom is fed through a resistor 4 of resistance value $R_1$ to the input terminal of an integrator 8. A rectangular waveform signal having a duty cycle of 50% is generated by a rectangular waveform signal generator 5 and is fed through an impedance converting buffer 6 and a resistor 7 of resistance value $R_2$ to the input terminal of integrator 8. The low frequency signal and rectangular wave signal are composed at the input side of integrator 8, and are integrated by the latter so that the integrator 8 produces a triangular wave signal which is shifted in phase from the rectangular wave signal. The integrated output signal from integrator 8 is fed to a high gain amplifier 9 which produces a pulse width modulated signal. This pulse width modulated signal is applied to a pulse power amplifier 10 and the output signal from the latter is fed to a low pass filter 12 which delivers an amplified low frequency output signal to an output terminal 13. A part of the output signal from pulse power amplifier 10 is shown to be negatively fed back through a negative feedback resistor 11 of resistance value $R_3$ to the input of integrator 8.

The operation of the prior art pulse width modulated signal amplifier shown on FIG. 1 will now be described with reference to FIGS. 2A to 2E. The rectangular waveform generator 5 produces a rectangular wave signal of amplitude $E_c$ and which has a duty cycle of 50%. When there is no low frequency input signal at input terminal 1, that is, when the rectangular wave signal is not modulated, at the input side of the integrator 8 there exists a current $e_c/R_2$ of amplitude $E_c/R_2$, as shown on FIG. 2A. Further, if a rectangular wave voltage $E_o$ is obtained at the output of pulse power amplifier 10, then a feedback current $e_o/R_3$ of amplitude $E_o/R_3$ (FIG. 2B) is supplied to the input of integrator 8. This feedback current is generally opposed to the current $e_c/R_2$ and is phase-shifted by, for example, $\pi/4$, as will be shown later. The above currents $e_c/R_2$ and $e_o/R_3$ are added to each other at the input side of integrator 8 as a sum current $(e_c/R_2) + (e_o/R_3)$ (FIG. 2C) which is then fed to integrator 8. Thus, integrator 8 produces an integrated output signal $-\int[(e_c/R_2) + (e_oR_3)]dt$, which is inverted in polarity, as shown on FIG. 2D. The integrated output signal (FIG. 2D) is fed through high gain amplifier 9 to pulse power amplifier 10, so that the latter produces, at its output terminal, a pulse width modulated signal which corresponds to the amplified current $e_o$ with the amplitude $E_o$, as shown by the solid line on FIG. 2E. The reason why the feedback current or output voltage of pulse power amplifier 10 is phase-shifted by $\pi/4$ is that the rectangular wave signal current $I_c$ satisfies the equation of $2I_F = I_c$ for feedback current $I_F$ and the inclination of the integrated waveform is 1 : 3.

When a low frequency signal exists at input terminal 1 and the rectangular wave signal is pulse modulated thereby, the current waveforms at the various parts of the circuit shown on FIG. 1 are changed, for example, as represented by dotted lines on FIGS. 2B, 2C, 2D and 2E, respectively. However, the rising-up time of the rectangular wave signal always has a constant period, and, therefore, the rectangular wave signal shown on FIG. 2E has a constant period of rising-up and only the going-down is varied in response to the level of the low frequency input signal.

With the prior art circuit shown on FIG. 1, the gain is $R_3/R_1$ and the condition for locking the carrier is $2E_o/R_3 \leq E_c/R_2$.

The prior art pulse width modulated signal amplifier described above with reference to FIG. 1 is advantageous in that the repeating frequency of the pulse width modulated signal can be made constant and the negative feedback can be sufficiently applied from the input side of low pass filter 12 to the input side of integrator 8 to provide a suitably low modulation distortion factor. However, since the low frequency signal as fed to integrator 8 and the amplified low frequency signal developed at the output terminal 13 are inverted in phase relative to each other, it is necessary to supply the input low frequency signal to integrator 8 through the inverter 2 as described above. Further, in the prior art amplifier, the input impedance to integrator 8 is determined by resistor 4, which, in turn determines the gain of the amplifier. Therefore, resistance value $R_1$ can not be set high, and the buffer 3 is necessary to provide a high input impedance for avoiding gain variations of the circuit due to variation of the input signal.

Referring now to FIG. 3, it will be seen that, in a pulse width modulated signal amplifier according to an embodiment of this invention, components thereof corresponding to parts of the prior art amplifier described with reference to FIG. 1 are identified by the same reference numerals. More particularly, in the amplifier according to this invention as illustrated on FIG. 3, an input terminal 1 which receives a low frequency signal, such as, an audio signal or the like, is connected to a non-converted or positive input (+) of a balanced type integrating circuit or integrator 8'. A rectangular wave signal from a rectangular wave signal generator 5 is fed to an impedance converting circuit 15 which consists of a buffer 6 for impedance conversion and a resistor 16 with a resistance value $R_5$ to change from a large impedance to a small one, and the rectangular wave signal is then fed to an inverted input terminal (−) of balanced type integrator 8'. The integrated output signal from integrator 8' is fed to a high gain amplifier 9 to provide a pulse width modulated signal which is then fed to the pulse power amplifier 10. The amplified pulse width modulated signal from pulse power amplifier 10 is fed at a low pass filter 12 to be demodulated into an amplified low frequency signal which is delivered to an output terminal 13. A part of the output of pulse power amplifier 10 is applied, as a negative feedback, through a resistor 14 of resistance value $R_4$ to the inverted input (−) of integrator 8'.

As shown on FIG. 4, the balanced type integrator 8' is a Miller integrator and consists of transistors $Q_{10}$, $Q_{11}$, $Q_{12}$, $Q_{13}$, $Q_{14}$, $Q_{15}$ and $Q_{16}$. Each of transistors $Q_{10}$, $Q_{11}$, $Q_{14}$, $Q_{15}$ and $Q_{16}$ is a bipolar transistor and each of transistors $Q_{12}$ and $Q_{13}$ is a junction type field effect transistor (FET). The FETs $Q_{12}$ and $Q_{13}$ have their sources grounded together through the constant current transistor $Q_{14}$ and their drains are connected to a power source $+B_1$ through transistors $Q_{10}$ and $Q_{11}$, respectively, which form a current mirror circuit. The drain of FET $Q_{12}$ is also connected to the base of transistor $Q_{15}$. The base of transistor $Q_{16}$, which is connected in complementary relation to transistor $Q_{15}$, is connected to the base of constant current transistor $Q_{14}$. The collectors of transistors $Q_{15}$ and $Q_{16}$ are connected together to one input terminal of high gain amplifier 9 for applying the output of integrator 8' to amplifier 9. Further, the collectors of transistors $Q_{15}$ and $Q_{16}$ are connected through a capacitor 20 to the gate of FET $Q_{13}$ which constitutes the inverted input of the integrator 8' of FIG. 4. The non-inverted or positive input of integrator 8' is constituted by the gate of FET $Q_{12}$ which is connected, through a suitable divider 1a consisting of resistors, as shown, to the input terminal 1 for receiving the low frequency signal applied to terminal 1.

The rectangular wave signal generator 5 is shown on FIG. 4 to consist of an oscillating transistor $Q_1$, bipolar transistors $Q_2$ and $Q_3$ which are connected differentially, an amplifying transistor $Q_4$ and an FET $Q_5$. In this example, a sinusoidal output signal, which is derived from an oscillator formed of transistor $Q_1$ and other passive elements, is applied through a coupling transformer 5a to the bases of transistors $Q_2$ and $Q_3$ connected differentially, and is wave-shaped as a rectangular wave signal. This rectangular wave signal is then amplified by transistor $Q_4$ for which the FET $Q_5$ serves as a constant current load. The amplified rectangular wave signal is fed through a capacitor 11 to buffer circuit 6 for impedance conversion in the latter.

The impedance conversion buffer circuit 6 is shown on FIG. 4 to be constituted by two stages of emitter-follower circuits. The first and second stages are shown to consist of bipolar transistors $Q_6$ and $Q_7$, and of bipolar transistors $Q_8$ and $Q_9$, respectively. The two stages of emitter-follower circuits are connected to perform a push-pull operation. The rectangular wave signal from the rectangular wave signal generator 5 is fed through capacitor 17 to the bases of transistors $Q_6$ and $Q_7$ of the first stage connected in common at a point $P_1$ and the output rectangular wave signal is derived from the emitters of transistors $Q_8$ and $Q_9$ of the latter stage connected together at a point $P_2$. This output signal appearing at the point $P_2$ is fed through resistor 16 having the resistance value of $R_5$ to the inverted input of balanced type integrator 8', that is, to the gate of FET $Q_{13}$. The bases of transistors $Q_6$ and $Q_7$, which are connected together, and the bases of transistors $Q_8$ and $Q_9$, which are also connected together, are grounded through resistors 18 and 19, respectively.

In the buffer circuit 6, the impedance at the input point $P_1$ can be selected to be about 10 KΩ in respect to DC by selecting the resistance values of resistors 18 and 19 at about 10 kΩ, and the input impedance in respect to AC can be made to be about several hundred ohms. The impedance at the point $P_2$ of the output side can be made to be $1/2\ h_{FE}^2$ *in respect to DC and AC, and can be selected to be sufficiently smaller than the resistance value* $R_5$ (=3.3 kΩ) of resistor 16 connected to the input side of integrator 8'. In this case, the value of $h_{FE}$ is, for example, about 100. Accordingly, the gain of the whole pulse width modulated signal amplifier shown on FIGS. 3 and 4 can be made to be substantially constant over the full frequency range.

In the above example, if the time constant determined by the capacity and resistance of coupling capacitor 17 and resistor 18, respectively, is selected small so as to make it possible to transmit the rectangular signal from the rectangular wave signal generator 5, and the output impedance at the point $P_2$ is reduced to a DC range by the buffer 6, the pulse width modulated signal amplifier can be provided with increased stability at the operating point when the power is supplied, the gain of the amplifier can be made constant over the full frequency range and the rising-up thereof is made rapid.

The low frequency signal applied to the non-inverted input of balanced type integrator 8', that is, the gate of FET $Q_{12}$, and the rectangular wave signal applied to the inverted input of integrator 8', that is, the gate of FET $Q_{13}$, are composed and then fed from the drain of FET $Q_{12}$ to the base of transistor $Q_{15}$. The integrated output signal appearing at the collector of transistor $Q_{15}$ is fed to one of the input terminals of high gain amplifier 9 as the next stage. A part of the output signal from pulse power amplifier 10 is applied through the negative feedback resistor 14 having the resistance value $R_4$ to the inverted input terminal of integrator 8' constituted by the gate of FET $Q_{13}$ so as to be there composed with the rectangular wave signal from buffer 6.

The high gain amplifier 9 is, for example, constituted by a balanced type limiter amplifier which may be formed as an integrated circuit. This integrated circuit is supplied with DC operating voltages from positive and negative power sources $+B_1$ and $-B_1$. As previously noted, high gain amplifier 9 is supplied, at one input terminal, with the integrated output signal from integrator 8' and has its other input terminal grounded through a resistor 9a. At the output terminal of amplifier 9 there is produced a pulse width modulated signal.

The pulse power amplifier 10 is shown on FIG. 4 to include a drive circuit consisting of bipolar transistors $Q_{17}$ and $Q_{18}$ connected in complementary relation and junction type FETs $Q_{19}$, $Q_{20}$, $Q_{21}$ and $Q_{22}$. The emitters of transistors $Q_{17}$ and $Q_{18}$ are connected together to the ground, and their bases are connected together to be supplied with the pulse width modulated signal from high gain amplifier 9. The collectors of transistors $Q_{17}$ and $Q_{18}$ are connected through constant current loads consisting of FETs $Q_{19}$ and $Q_{20}$ to positive and negative DC power sources $+B_2$ and $-B_2$ and also to the gates of FETs $Q_{21}$ and $Q_{22}$, respectively, which form a push-pull output stage. The FETs $Q_{21}$ and $Q_{22}$, respectively, which form a push-pull output stage. The FETs $Q_{21}$ and $Q_{22}$ have their drains connected together to low pass filter 12 and to the inverted input terminal of balanced type integrator 8' through the negative feedback resistor 14. The sources of FETs $Q_{21}$ and $Q_{22}$ are connected to positive and negative DC power sources $+B_3$ and $-B_3$, respectively. The DC power sources $\pm B_2$ have the highest absolute values and the DC power sources $\pm B_1$ have the lowest absolute values, that is, DC power sources $\pm B_3$ have values between those of the sources $\pm b_1$ and $\pm b_2$.

The low pass filter 12 is formed of a coil 12a and a capacitor 12b and has its output side connected to the output terminal 13 at which an amplified low frequency signal is obtained. Thus, the carrier component of the pulse width modulated signal from the pulse power amplifier 10 is removed by the low pass filter 12 and the original low frequency signal, as amplified, is delivered to the output terminal 13.

The gain of the pulse width modulated signal amplifier ($R_4 + R_5$)/$R_5$ and its carrier lock condition is $2E_o/r_4 < E_c/R_5$. In this case, $E_o$ represents the amplitude of the rectangular wave voltage which is obtained at the output side of the pulse power amplifier 10 and $E_c$ represents the amplitude of the rectangular wave voltage which is obtained at the output side of buffer 6.

If the value of the negative feedback current is elected to be smaller than that of the triangular wave carrier, the latter can be modulated up to a modulation factor of 100%.

When the pulse width modulated signal amplifier according to this invention is used in a 2-channel or 4-channel stereo reproduction apparatus, the rectangular wave signal generator 5 and buffer 6 can be common to all of the channels, as is indicated in FIG. 4.

It will be noted that, in the pulse width modulated signal amplifier according to this invention, as described above with reference to FIGS. 3 and 4, the low frequency input signal can be applied directly to integrator 8' from input terminal 1 without requiring the interposed inverter 2 of the prior art amplifier of FIG. 1. Further, in the amplifier according to this invention a high gain which does not vary with the input signal can be achieved without requiring the buffer 3 includes in the prior art amplifier to provide a high input impedance.

Although the amplifier according to this invention as described above with reference to FIGS. 3 and 4 employs a part of the output of pulse power amplifier 10 as the negative feedback through resistor 14, it will be appreciated that the negative feedback may be derived from the output of high gain amplifier 9, that is, resistor 14 may be connected between the output of high gain amplifier 9 and the second or inverted input (−) of integrator 8' constituted by the gate of FET $Q_{13}$ on FIG. 4.

Having described an illustrative embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A pulse width modulated signal amplifier comprising:
    an input terminal for receiving a modulating signal;
    means for providing a rectangular wave signal as a carrier;
    integrating means having a non-converted input, an inverted input and an output, said non-inverted input being connected to said input terminal to receive said modulating signal;
    means for applying said rectangular wave signal to said inverted input of the integrating means;
    amplifying means connected with said output of the integrating means for providing an amplified pulse width modulated signal output;
    a low pass filter receiving said output of the amplifying means for providing an amplified demodulated signal corresponding to said modulating signal applied to said input terminal; and
    a negative feedback circuit for applying a part of said output of the amplifying means to inverted input of the integrating means.

2. A pulse with modulated signal amplifier according to claim 1; in which said means for applying the rectangular wave signal to said inverted input of the integrating means includes impedance circuit means.

3. A pulse width modulated signal amplifier according to claim 2; wherein said impedance circuit means includes an impedance converting circuit having an input receiving said rectangular wave signal and an output, and a first resistor connected between the output of said impedance converting circuit and the inverted input of said integrating means.

4. A pulse with modulated signal amplifier according to claim 3; wherein said negative feedback circuit includes a second resistor through which said part of the output of said amplifying means is applied to the inverted input of said integrating means.

5. A pulse width modulated signal amplifier according to claim 2; wherein said negative feedback circuit includes a resistor through which said part of the output of said amplifying means is applied to said inverted input of the integrating means.

6. A pulse width modulated signal amplifier according to claim 1; in which said amplifying means includes high gain amplifying means and pulse power amplifying means connected in sequence between said output of the integrating means and said low pass filter, and said negative feedback circuit applies output of said pulse power amplifying means to said inverted input of the integrating means.

7. A pulse width modulated signal amplifier according to claim 1, in which said integrating means includes a differential amplifying circuit having a first transistor connected to said non-inverted input for receiving said modulating signal, and a second transistor connected to said inverted input for receiving said rectangular wave signal and said part of said output of the amplifying means.

8. A pulse width modulated signal amplifier comprising an input terminal for receiving a modulating signal; means for providing a rectangular wave signal as a carrier; integrating means having a first input connected to said input terminal to receive said modulating signal, a second input and an output, said integrating means includes a differential amplifying circuit having first and second transistors each having an input electrode and first and second output electrodes, and an output circuit having third and fourth transistors each having an input electrode and first and second output electrodes, first and second DC power sources, a constant current source through which said first output electrodes of said first and second transistors are connected together to said first DC power source, first and second loads through which said second output electrodes of said first and second transistors are respectively connected to said second DC power source, the first output electrodes of said third and fourth transistors being connected together to said output of the integrating means, a capacitor connecting the input elecrode of said second transistor to said connected together first output electrodes of the third and fourth transistors, the second output electrodes of said third and fourth transistors being connected to said first and second DC power sources, respectively, the input electrode of said third transistor being connected to the second output electrode of said first transistor, the input electrode of said fourth transistor being connected to said constant current source, the input electrode of said first transistor constituting said first input of the integrating means and being supplied with said modulating signal, the input electrode of said second transistor constituting said second input of the integrating means and being supplied with said rectangular wave signal and with a feedback signal amplifying means connected with said output of the integrating means for providing an amplified pulse width modulated signal output; a low pass filter receiving said output of the amplifying means for providing an amplified demodulated signal corresponding to said modulating signal applied to said input terminal; and a negative feedback circuit for applying a part of said output of the amplifying means to said second input of the integrating means as said feedback signal.

9. A pulse width modulated signal amplifier according to claim 7; wherein said means for applying the rectangular wave signal to said second input of the integrating means includes an impedance circuit as a buffer between said means providing the rectangular wave signal and said input electrode of the second transistor.

10. A pulse width modulated signal amplifier according to claim 9; in which said first and second loads are constituted by respective transistors connected to form a current mirror circuit.

* * * * *